US010570009B2

(12) United States Patent
Allegato et al.

(10) Patent No.: US 10,570,009 B2
(45) Date of Patent: Feb. 25, 2020

(54) MEMS DEVICE FORMED BY AT LEAST TWO BONDED STRUCTURAL LAYERS AND MANUFACTURING PROCESS THEREOF

(71) Applicant: STMICROELECTRONICS S.R.L., Agrate Brianza (IT)

(72) Inventors: Giorgio Allegato, Monza (IT); Laura Oggioni, Milan (IT); Matteo Garavaglia, Magenta (IT); Roberto Somaschini, Vimercate (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/283,254

(22) Filed: Feb. 22, 2019

(65) Prior Publication Data
US 2019/0185318 A1    Jun. 20, 2019

Related U.S. Application Data

(62) Division of application No. 15/379,091, filed on Dec. 14, 2016, now Pat. No. 10,227,233.

(30) Foreign Application Priority Data

Jun. 27, 2016   (IT) .................. 102016000066164

(51) Int. Cl.
*B81C 1/00*    (2006.01)
*B81C 3/00*    (2006.01)
*B81B 3/00*    (2006.01)

(52) U.S. Cl.
CPC ........ *B81C 1/00269* (2013.01); *B81B 3/0097* (2013.01); *B81C 3/001* (2013.01);
(Continued)

(58) Field of Classification Search
CPC ...... B81B 1/00–008; B81B 3/00–0097; B81B 5/00; B81B 7/00–04;
(Continued)

(56) References Cited

U.S. PATENT DOCUMENTS 7,121,402 B2 * 10/2006 Van Heerden ......... B65D 77/10
                                                               206/222
7,531,897 B2   5/2009 Mastromatteo
(Continued)

FOREIGN PATENT DOCUMENTS

DE    112012005288 T5   9/2014
EP          2259018 A1  12/2010

*Primary Examiner* — Jonathan Han
(74) *Attorney, Agent, or Firm* — Seed Intellectual Property Law Group LLP (57) ABSTRACT

A microelectromechanical device having a first substrate of semiconductor material and a second substrate of semiconductor material having a bonding recess delimited by projecting portions, monolithic therewith. The bonding recess forms a closed cavity with the first substrate. A bonding structure is arranged within the closed cavity and is bonded to the first and second substrates. A microelectromechanical structure is formed in a substrate chosen between the first and second substrates. The device is manufactured by forming the bonding recess in a first wafer; depositing a bonding mass in the bonding recess, the bonding mass having a greater depth than the bonding recess; and bonding the two wafers.

20 Claims, 5 Drawing Sheets

(52) U.S. Cl.
CPC ......... *B81B 2201/0242* (2013.01); *B81B 2201/0264* (2013.01); *B81B 2201/042* (2013.01); *B81B 2203/0315* (2013.01); *B81C 2201/019* (2013.01); *B81C 2203/019* (2013.01); *B81C 2203/0118* (2013.01); *B81C 2203/037* (2013.01)

(58) Field of Classification Search
CPC ......... B81B 2201/00–13; B81B 2203/00–06; B81B 2207/00–99; B81B 3/0021; B81B 7/007; B81B 2201/042; H04R 2201/003
USPC .................. 438/50, 52; 257/E21.613
See application file for complete search history.

(56) References Cited

U.S. PATENT DOCUMENTS

| | | | |
|---|---|---|---|
| 8,050,011 B2 | 11/2011 | Mastromatteo | |
| 8,669,141 B2 * | 3/2014 | Freguglia | B81C 1/00269 438/119 |
| 2009/0079037 A1 * | 3/2009 | Weber | B81B 7/0051 257/618 |
| 2010/0301432 A1 * | 12/2010 | Kittilsland | B81C 1/00269 257/417 |
| 2011/0298063 A1 | 12/2011 | Mayer | |
| 2012/0217638 A1 | 8/2012 | Tanaka et al. | |
| 2015/0097215 A1 | 4/2015 | Chu et al. | |

\* cited by examiner

MEMS DEVICE FORMED BY AT LEAST TWO BONDED STRUCTURAL LAYERS AND MANUFACTURING PROCESS THEREOF

BACKGROUND

Technical Field

The present disclosure relates to a MEMS device formed by at least two bonded structural layers and to the manufacturing process thereof.

Description of the Related Art

As is known, micromachining techniques, based upon manufacturing technologies typical of microelectronics, enable obtainment of microsystems, such as microsensors, microactuators, and special micromechanisms, which exploit the excellent mechanical properties of monocrystalline silicon and may be manufactured using the knowledge and advantages typical of microelectronic processes.

In particular, the bulk-micromachining technique generally comprises bonding the wafer where the MEMS device is to be provided (hereinafter also referred to as device wafer or substrate) to one or more wafers or substrates (for example, handling wafers or substrates, cap wafers or substrates, etc., also referred to hereinafter as auxiliary wafers).

Typically, the manufacturing process comprises processing the device wafer for defining the desired microelectromechanical structures, for example via dry silicon-etching processes and bonding the device wafer to the auxiliary wafer, for example via adhesive, such as glass frit or polymer, or by a metal bond, for example via a eutectic bond such as Al—Ge, Au—Ge, Au—Sn, Cu—Sn, etc., and subsequent dicing the composite wafer to obtain a plurality of devices.

The device wafer may even be composite and be obtained by bonding two wafers, for example when a MEMS device has offset comb-fingered driving/sensing electrodes. In this case, two wafers are bonded together, to form the composite wafer, which is bonded to the auxiliary wafer.

For instance, FIGS. 1A-1D show typical process steps for manufacturing a MEMS micromirror.

Figure 1A:
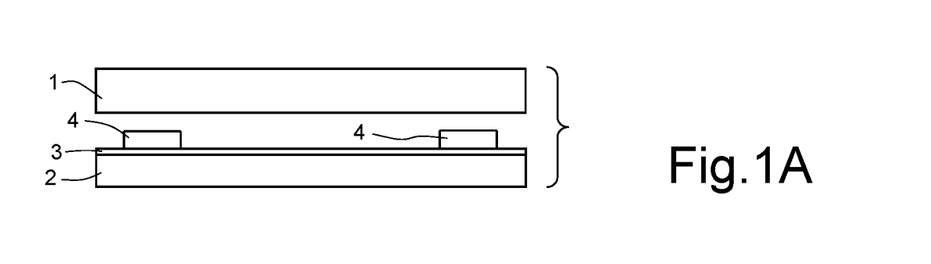
FIGS. 1A-1D are cross-sections of semiconductor material wafers in successive steps of a known manufacturing process.

In detail, FIG. 1A shows two starting wafers including a device wafer 1 and an auxiliary wafer 2. Here, an etch-stop layer 3, for example of silicon oxide, extends on the auxiliary wafer, and bonding regions 4, for example of glass frit, polymer or metal, extend over the etch-stop layer 3.

Figure 1B:
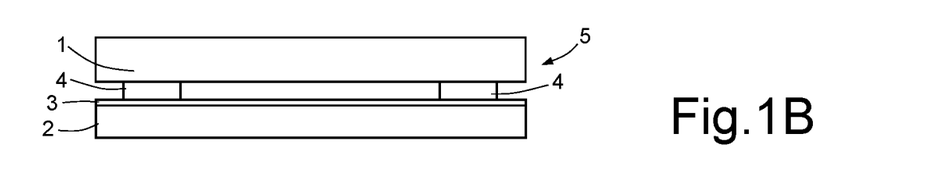

In FIG. 1B, the device wafer 1 and the auxiliary wafer 2 are brought into contact and bonded by the bonding regions 4, by exerting a slight pressure and at a preset temperature, to obtain a bonded wafer 5.

Figure 1C:
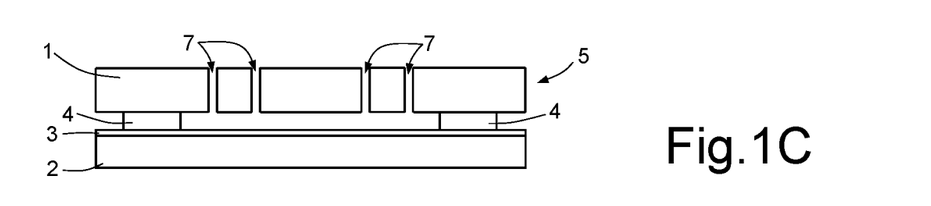

In FIG. 1C, the device wafer 1 is processed for defining suspended masses of the desired micromechanical structures. For instance, for forming a micromirror, the micromirror structure, supporting arms, actuation electrodes (for example, of a comb-fingered type), and elastic springs are defined. In particular, definition comprises removing the semiconductor material throughout the thickness of the device wafer, and forming through trenches 7. In this step, the auxiliary wafer 2 is not etched, being protected by the etch-stop layer 3 and by a possible peripheral protective layer.

Figure 1D:
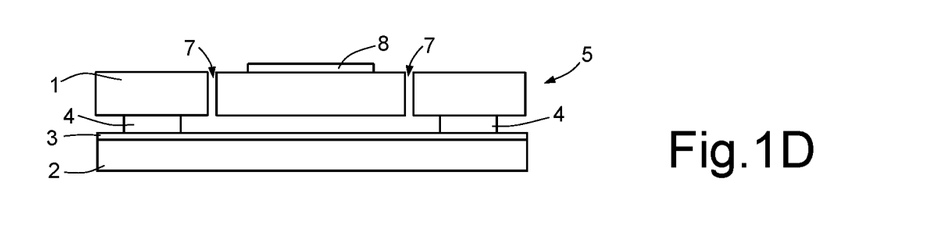

In FIG. 1D, a reflecting surface 8 is formed, by depositing and patterning a metal layer.

Figure 2A:
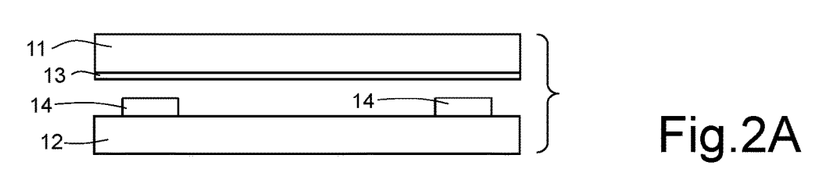
FIGS. 2A-2D are cross-sections of semiconductor material wafers in successive steps of another known manufacturing process.
Figure 2B:
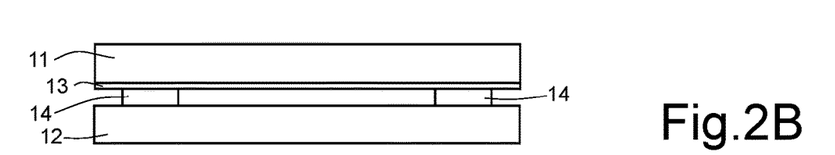
Figure 2C:
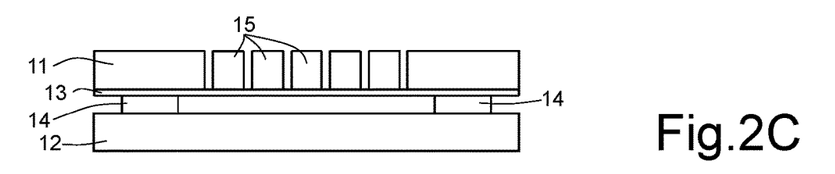
Figure 2D:
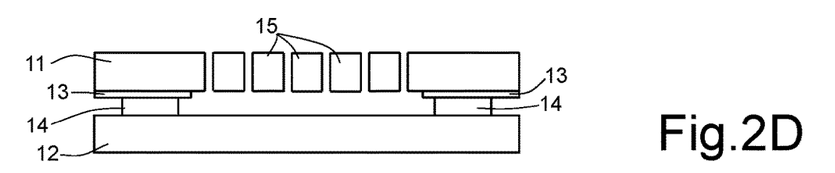

FIGS. 2A-2D show a different manufacturing process, for example for manufacturing an inertial sensor, wherein a device wafer 11 has an etch-stop layer 13, and an auxiliary wafer 12 has bonding regions 14 (FIG. 2A). Similarly to FIGS. 1A-1D, the process comprises bringing the wafers 11-12 into contact (FIG. 2B), defining micromechanical structures 15 (in particular, a sensing mass, actuation/sensing electrodes (for example, of a comb-fingered type) and elastic springs, by etching the semiconductor material of the device wafer 11 (FIG. 2C); and selectively removing the etch-stop layer 13, for example by HF etching.

In a way not shown, the auxiliary wafer 12 may comprises cavities enabling a sufficient movement of the suspended masses.

With the manufacturing processes described with reference to FIGS. 1 and 2, it is possible to form MEMS scanning micromirrors, inertial sensors, and other sensors, such as gyroscopes, resonators, and electromagnetically actuated scanning micromirrors.

Furthermore, with these manufacturing processes, the problem exists that the bonding regions may be damaged or even partially removed when defining the structures and/or removing the etch-stop layers. In fact, to carry out wet etching, for example for removing the photoresist layer and for cleaning the polymers from the walls of the operating regions, and for carrying out vapor etching, for example for HF cleaning or releasing structures, chemical substances are used that may damage the bonding regions.

Consequently the choice of the material of the bonding regions is limited to materials capable of withstanding the above processes.

This imposes, however, design limitations and does not always enable optimal materials to be used.

BRIEF SUMMARY

According to one or more embodiments, the present disclosure is directed to a micromachined semiconductor device and a corresponding manufacturing process.

In practice, the bonding layer between two wafers is accommodated inside a cavity formed on the surface of one of the two wafers. The bonding layer is deposited with a thickness slightly greater than the depth of the cavity and is compressed during bonding. In this way, after bonding the two wafers, the bonding layer is completely housed in a cavity, and the latter is completely surrounded by abutting portions of the wafers, which form a sort of seal for the cavity. Consequently, the bonding layer is protected inside the cavity and is not exposed to chemical substances in the subsequent steps.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

In the attached figures, similar elements are designated in the various figures starting from the numbering used for the embodiment of FIGS. 3A-3G, adding each time 100, so that, in each figure, the first digit (the hundreds) indicates the number of that figure, and the other two digits (the tens and the units) designate elements that are similar in all the figures.

Figure 3A:
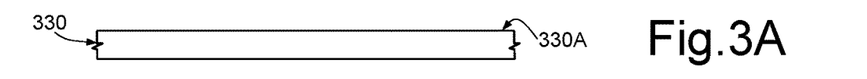
FIGS. 3A-3G are cross-sections of semiconductor material wafers in successive steps of an embodiment of the present manufacturing process.

FIG. 3A shows an auxiliary wafer 330 of semiconductor material, for example of monocrystalline silicon, having a bonding face 330A.

Figure 3B:
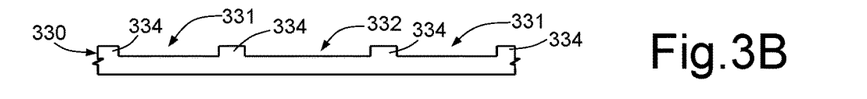
Figure 3C:
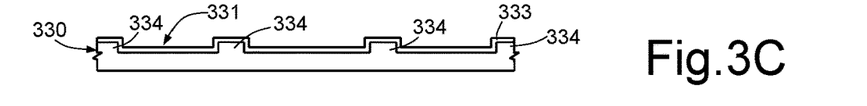
Figure 3D:
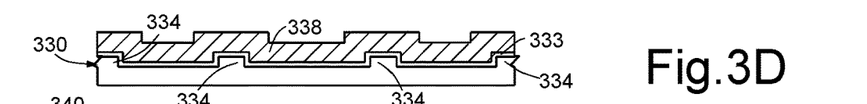
Figure 3E:
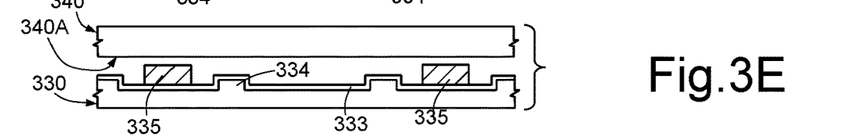
Figure 3F:
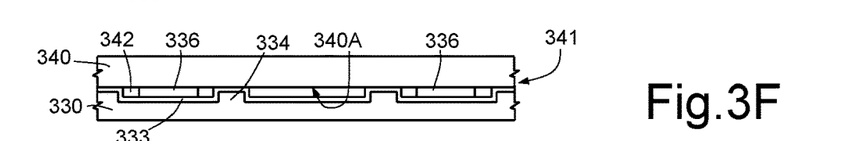
Figure 3G:
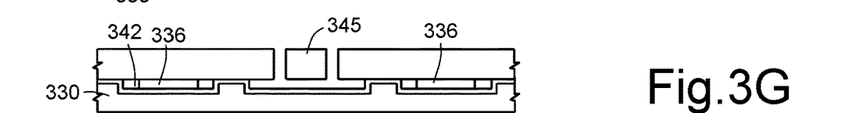
Figure 3H:
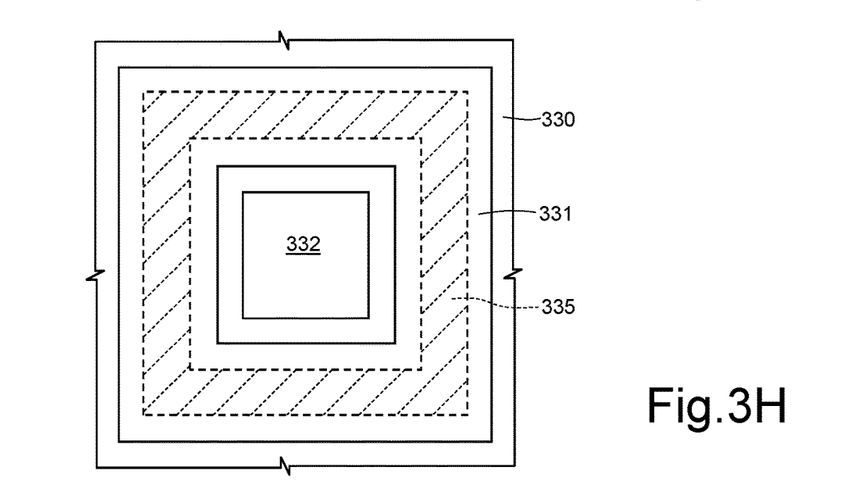
FIG. 3H is a top plan view of a part of the structure of FIG. 3B.

In FIG. 3B, the auxiliary wafer 330 is etched, starting from its bonding face 330A, by dry or wet silicon etching (for example, by TMAH—tetramethylammonium hydrate—or KOH—potassium hydroxide) for forming a bonding recess 331 and, in the embodiment shown, a functional recess 332, as represented in the top plan view of FIG. 3H. The bonding recess 331 here surrounds the functional recess 332 and has a closed shape, for example rectangular. For instance, the bonding recess 331 has a depth comprised between 1 µm and 20 µm and a width comprised between 10 µm and 1 mm; the functional recess 332, to be overlaid by a MEMS structure (as explained hereinafter) and having the function of enabling movement thereof, has dimensions linked to the overlying MEMS structure. In particular, the functional recess 332 may have the same depth as the bonding recess or a greater depth (obtained through a suitably designed further etch) or the same depth as the bonding recess 31. In this step, projecting portions 334 are formed at the sides of the bonding recess 331.

With reference to FIG. 3C, an etch-stop layer 333, for example of silicon oxide, is deposited on the auxiliary wafer 330 and coats the entire top surface of the auxiliary wafer 330.

With reference to FIGS. 3D, 3E, within the bonding recess 331, a material forming a bonding mass 335 is deposited on the etch-stop layer 333. To this end (FIG. 3D), a bonding layer 338, for example of glass frit, polymeric material (e.g., a dry film of BCB—benzocyclobutene) or of an eutectic material (e.g., formed by alternating layers, such as Al—Ge, Au—Ge, Au—Sn, Cu—Sn) or a thermocompression metal, such as Au—Au or Cu—Cu, is deposited. The bonding layer 338 has a total height greater than that of the bonding recess 331, for example from 1-2 µm for eutectic material, to approximately 20 µm for glass frit, up to 50 µm, for dry film and 1-20 µm for thermocompression metal. The bonding layer 338 is defined (FIG. 3D), to be removed on the outside of the bonding recess 331 and to have a width smaller than that of the bonding recess 331, for the reasons explained hereinafter (see also the dashed line in FIG. 3H). In this way, the bonding mass 335 has a greater height than the projecting portions 334 and projects from the bonding recess 331.

The auxiliary wafer 330 is fixed to a device wafer 340, of semiconductor material, for example monocrystalline silicon, having a bonding face 340A (FIG. 3E). In particular, the bonding face 340A of the device wafer 340 is brought in abutment with the projecting portions 334 of the auxiliary wafer 330.

The wafers 330, 340 are then bonded together by applying appropriate pressure and heat, typically according to the materials, in a way known to a person of ordinary skilled in the art. For instance, bonding is carried out at a temperature of around 280° C. in case of eutectic material with an Au—Sn base, of around 420° C. in case of a eutectic material with an Au—Ge base, at temperatures lower than 200° C. in case of polymeric materials, at approximately 450° C. in case of glass frit, and at approximately 400° C. in case of thermocompression metal. In the latter case, bonding is carried out at high pressure, for example higher than 20 MPa. Consequently, the bonding mass 335 is compressed and may possibly expand laterally to form a bonding structure 336 that has a chemico-physical bond with the auxiliary wafer 330 and the device wafer 340.

A composite wafer 341 is thus formed having a cavity 342 at the bonding recess 331 of the auxiliary wafer 330 (FIG. 3F). The cavity 342 thus has a closed shape, for example rectangular, and accommodates the bonding structure 336, which is sealed from the adjacent projecting portions 334, in abutment with the bonding surface 340A of the device wafer 340. Furthermore, the bonding structure 336 does not contaminate the other areas of the device wafer 340, for example the functional areas where the MEMS structures are to be formed, since it is contained in the cavity 342.

In this step, also a chemico-physical bond may be obtained between the etch-stop layer 333 and the device wafer 340, contributing to bonding of the wafers 330 and 340 and further sealing the cavity 342.

With reference to FIG. 3G, the composite wafer 341 is processed to provide the desired MEMS structures, removing, for example, portions of the device wafer 340 and forming, for example, a suspended platform 345 arranged above the functional recess 332. In this step, the bonding structure 336 is not exposed to the chemical substances used for defining the MEMS structures and/or for cleaning, since it is sealed inside the cavity 342. Consequently, a wet-etching process may also be used. Even if chemical substances seep into the cavity, the amount of these substances would be very low and would not jeopardize the overall integrity of the bonding structure 336.

Figure 4:
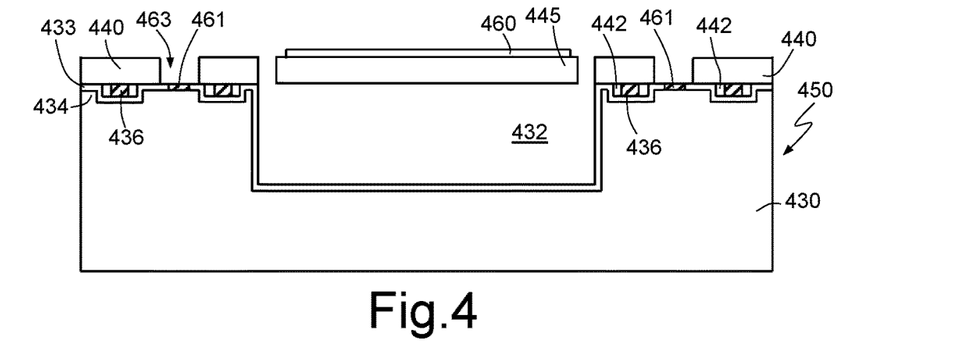
FIG. 4 is a cross-section of a MEMS device obtained with the process of FIGS. 3A-3H.

In this way, it is possible, for example, to form a micromirror device 450, as represented in FIG. 4. In this figure, the MEMS structure comprises a platform 445. Here, a functional recess 432, having a greater depth than the cavity 442, extends underneath the platform 445 to enable a sufficient mobility of the platform, in particular a sufficient angle of rotation. A reflecting layer 460 extends on the platform 445. Furthermore, contact pads 461 are formed on the auxiliary wafer 430, extend through the etch-stop layer 433 (operating also as an insulation) and are accessed through openings 463 in the device wafer 440.

Figure 5:
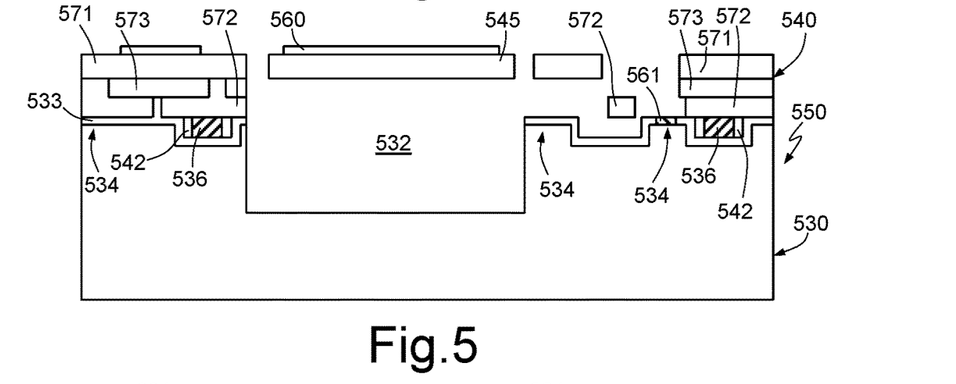
FIG. 5 is a cross-section of another MEMS device obtained with the process of FIGS. 3A-3H.

FIG. 5 shows a different micromirror device 450, where the device wafer 340 is replaced by a double wafer 540, formed by two silicon layers 571-572 (for example, a monocrystalline-silicon substrate and a polycrystalline-silicon layer grown on top) for forming offset mobile/fixed electrodes on two different levels. An insulation layer 573 extends selectively between the two silicon layers.

In both cases, the bonding structures 436, 536 are accommodated in cavities 442, 542 enclosed between an auxiliary substrate 430, 530 and a device substrate 440, 540, having a single or double layer, due to the presence of a recess in the auxiliary substrate 430, 530 and to the presence of projecting regions 434, 534 of the auxiliary substrate 430, 530 in contact with the device substrate 440, 540, through an etch-stop layer 433, 533.

The bonding structures 436, 536 bond the device substrate 440, 540 and the auxiliary substrate 430, 530 and extend along a line surrounding the microelectromechanical structure 445, 545, preferably along a closed line, such as the perimeter of a rectangle.

Figure 6A:
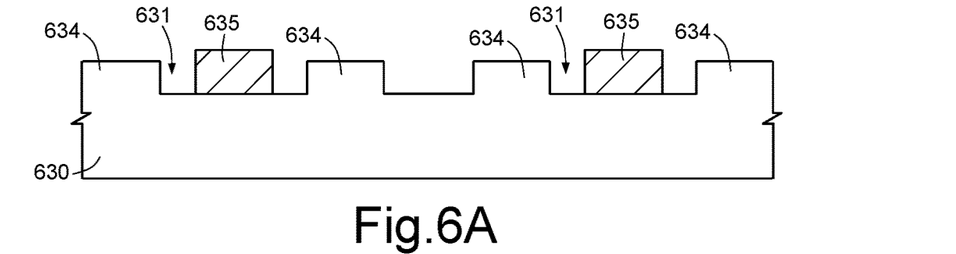
FIGS. 6A-6B are cross-sections of semiconductor material wafers in successive steps of a different embodiment of the present manufacturing process.
Figure 6B:
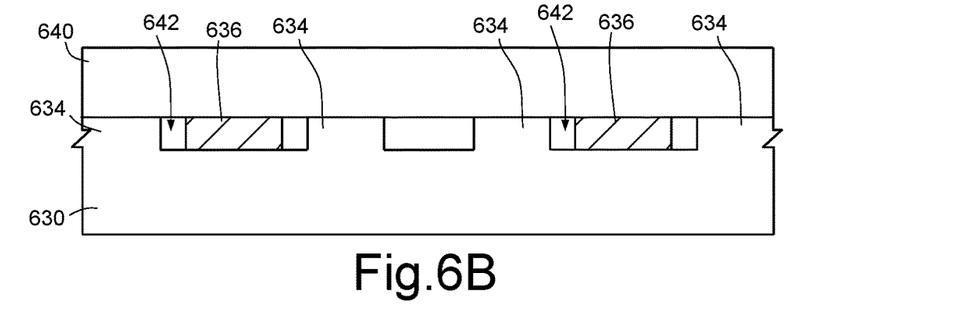

FIGS. 6A and 6B show an embodiment wherein the bonding recesses are formed in a hard-stop layer.

With reference to FIG. 6A, the manufacturing process comprises depositing and patterning a hard-stop layer to form projecting regions 634 above a first wafer 630, for example the auxiliary wafer. The hard-stop layer, and thus the projecting regions 634, are made of a material that is mechanically resistant to pressure (or in any case less compliant than the bonding mass 635), such as polycrystalline silicon, for example deposited epitaxially and patterned via silicon etching. Alternatively, a dielectric material may be used, such as PECVD (Plasma-Enhanced Chemical Vapor Deposition) or LPCVD (Low-Pressure Chemical Vapor Deposition) deposited oxide or thermally grown oxide, patterned by dry-etching or wet-etching; a metal, such as Au, Al, deposited by PVD (Physical Vapor Deposition) and patterned by dry or wet etching; or a metal, such as gold, selectively deposited by electrochemical deposition; or a photosensitive polyimide layer.

The projecting regions 634 delimit at least one bonding recess 631 having a similar shape to the bonding recess 331 of FIG. 3G. In the bonding recess 631, a bonding mass 635 is deposited, similarly to what above described for the bonding mass 335 of FIGS. 3C-3G. Also here, the bonding mass 635 has a height greater than the projecting regions 634.

With reference to FIG. 6B, a second wafer 640, for example the device wafer, is fixed to the first wafer 630, causing it to adhere to the projecting portions 634 of the first wafer 630 and thus compressing the bonding mass 635, which also couples to the second wafer 640, bonding it to the first wafer 630. The second wafer 640 thus closes the bonding recess 631 at the top, forming a cavity 642 sealed to the outside.

Figure 7:
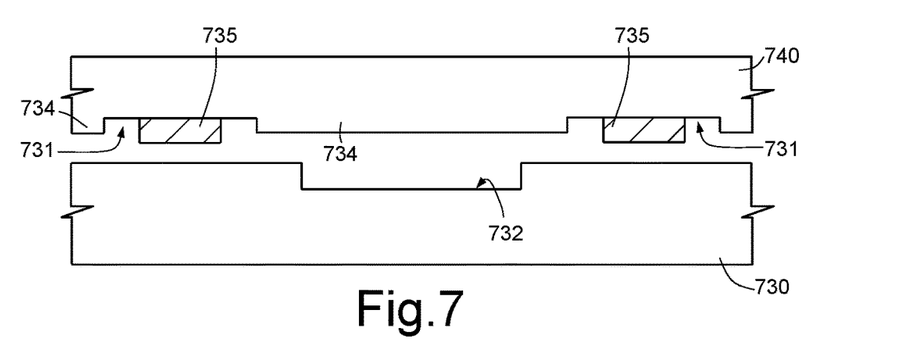
FIGS. 7 and 8 are cross-sections of different embodiments of the present process.

In yet another embodiment, FIG. 7, the bonding recess 731 and the bonding mass 735 are formed in the device wafer 740. The auxiliary wafer 730 has a functional recess 732.

Figure 8:
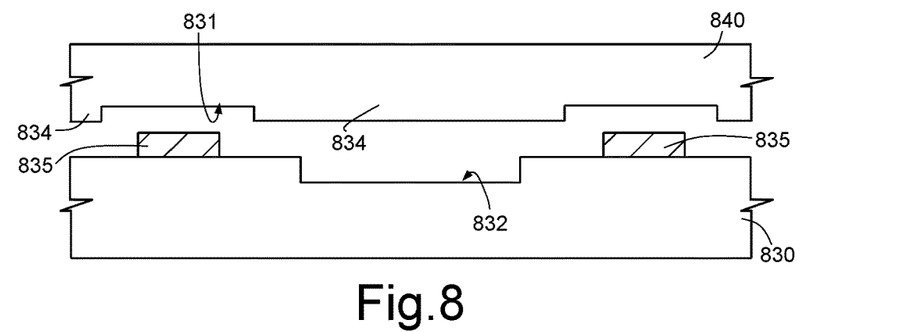

In FIG. 8, the auxiliary wafer 830 forms the functional recess 832, whereas the bonding recess 831 is formed in the device wafer 840. Furthermore, here, the bonding regions 836 are formed on the auxiliary wafer 830, in a position such as to be arranged inside the bonding recess 831 during coupling of the wafers 830, 840.

Figure 9A:
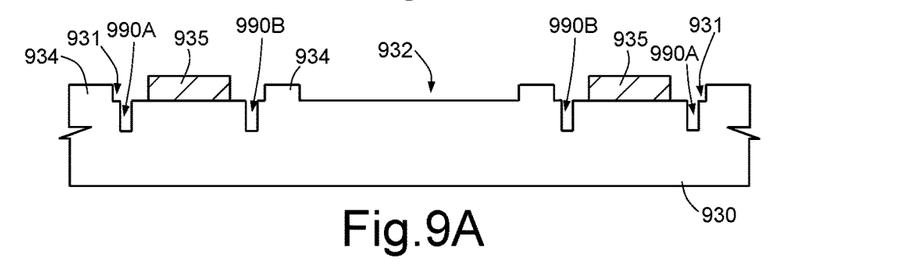
FIGS. 9A-9B are cross-sections of semiconductor material wafers in successive steps of yet another embodiment of the present manufacturing process.
Figure 9B:
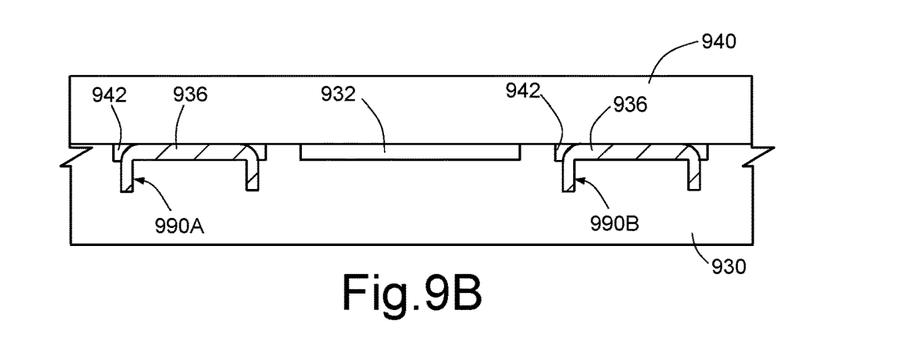

FIGS. 9A and 9B show two process steps of an embodiment useful when the bonding material risks contaminating other portions of the device. To prevent this, one of the two wafers, here the auxiliary wafer 930, has containment trenches 990A, 990B extending from the bonding recess 931 towards the inside of the auxiliary wafer 930. For instance, here, two containment trenches 990A, 990B are formed near the external and internal perimeter, respectively, of the bonding recess 931, so as to extend on the sides of the bonding mass 935 prior to bonding the wafers 930, 940 (FIG. 9A).

During coupling of the wafers 930, 940, the bonding mass 935, melted by the high temperature and compressed when the two wafers 930, 940 are brought near and into abutment to each other, may flow inside the containment trenches 990A, 990B, as represented in FIG. 9B. In this way, the containment trenches 990A, 990B may prevent overflow of the material from of the cavity 942. This is useful in particular when the bonding regions 936 are made of glass frit or eutectic material.

With the solution described, as explained above, the bonding regions are arranged inside a closed cavity, within the device. In this way, the bonding regions are protected from chemical materials used in the process steps after bonding the wafers, preventing them from being damaged and, in the case of partial etching, preventing contamination of the "useful" area of the device.

Furthermore, the bonding regions are protected from the external environment also during operation of the device, which thus may have a longer service life.

The described solution may be applied to micromachined devices of a different type comprising bonding of two wafers, as in the case of bulk micromachining of microelectromechanical devices, such as pressure sensors.

Finally, it is clear that modifications and variations may be made to the device and the manufacturing process described and illustrated herein, without thereby departing from the scope of the present disclosed.

For instance, the various described embodiments may be combined for providing further solutions.

In particular, all the embodiments represented may have an etch-stop layer, similar to layer 333 of FIGS. 3C-3F. Alternatively, also the embodiment of FIGS. 3A-3G may be without the etch-stop layer, if the etching processes so allow. Where present, the etch-stop layer may extend also on the sensor wafer and/or in the silicon etching areas. Furthermore, containment trenches similar to the trenches 990A, 990B of FIGS. 9A and 9B may be provided also in the embodiments of FIGS. 4-8.

The bonding structure may have a non-continuous shape, and may comprise two or more portions arranged along and inside the bonding recess, provided that they define as a whole a sufficient bonding area.

Also the bonding recess, and the corresponding cavity, may have a non-continuous shape, and comprise two or more portions arranged in succession along a closed line or a spiral. In this case, also the bonding structure may comprise a number of bonding portions, with one or more bonding portions arranged in the recess portions, provided that also in this case as a whole a sufficient bonding area is obtained.

As an alternative or in addition to the containment trenches, the bonding structure may be obtained by depositing non-continuous bonding material in the bonding cavity, which, during compression due to bonding, expands also in a longitudinal direction of the cavity (in a direction perpendicular to the plane of the drawing) and forms an approximately continuous bonding structure.

According to one aspect of the present description, a microelectromechanical device comprises:
a first substrate;
a second substrate;
a microelectromechanical structure formed in the first substrate;
projecting portions formed between the first and second substrates;
a closed cavity, delimited between the projecting portions, the first and second substrates; and a bonding structure inside the closed cavity, the bonding structure bonding the first and second substrates to each other.

According to another aspect of the present disclosure, the first and second substrates are of semiconductor material, the projecting portions comprise contrast regions of a first material, and the bonding structure is of a second material, for example not a semiconductor, and is more compliant than the first material.

According to yet another aspect of the present disclosure, a process for manufacturing a microelectromechanical device comprises:

forming a microelectromechanical structure in a first substrate or in a second substrate;

in the first substrate, forming projecting portions delimiting a bonding recess;

depositing bonding material on the first substrate or on a second substrate, at the bonding recess; and bringing the second substrate into contact with the projecting portions, the bonding recess forming a closed cavity delimited between the projecting portions and the first and second substrates; and bonding the first and second substrates, causing the bonding material to bond to the first and second wafers and forming a bonding structure inside the closed cavity.

As indicated above, the various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a microelectromechanical structure in a first substrate having a first face, wherein the forming includes forming a suspended platform and a peripheral portion that surrounds the suspended platform, at least a portion of the suspended platform being spaced apart from the peripheral portion;
   forming, in a second surface of a second substrate, a first recess delimited by projecting portions that are monolithic with the second substrate;
   depositing, on at least one of the first substrate and the second substrate, a bonding material in an area corresponding to the first recess; and
   bonding the first substrate to the second substrate by coupling the first face of the first substrate to the second face of the second substrate such that the first recess forms a closed cavity with the first face of the first substrate, the bonding material being positioned in the closed cavity, wherein the second substrate has a second recess facing the suspended platform.

2. The method of claim 1, wherein the bonding material, prior to the bonding, has a height that is greater than a depth of the first recess, wherein the bonding comprises compressing the bonding material to form a bonding structure.

3. The method of claim 2, wherein the bonding structure does not completely fill the first recess.

4. The method of claim 1, wherein the bonding material includes a material chosen from glass frit, polymer, eutectic metal, and thermocompression metal.

5. The method of claim 1, wherein the bonding includes exposing the bonding material to a temperature ranging between 150° C. and 450° C.

6. The method of claim 1, wherein the closed cavity surrounds the microelectromechanical structure.

7. The method of claim 1, further comprising forming an etch-stop layer on the first face or the second face.

8. A method for manufacturing a microelectromechanical device, the method comprising:
   forming a microelectromechanical structure in a first substrate;
   forming a first recess in a second substrate having a first surface and a second surface opposite the first surface, the first recess surrounding a central portion and extending from the first surface toward the second surface, the first recess being defined by a first planar surface that is a first distance from the second surface;
   forming one or more trenches in the first recess, wherein the one or more trenches have planar surfaces that are a second distance from the second surface, the second distance being smaller than the first distance;
   depositing a bonding material on the first substrate in the first recess; and
   coupling the second substrate to the first substrate with the bonding material such that the microelectromechanical structure formed in the first substrate faces the central portion of the second substrate, the bonding material surrounding the central portion of the second substrate, wherein the bonding material flows into the one or more trenches.

9. The method according to claim 8, wherein the bonding material is deposited to have a height that is greater than a depth of the first recess, wherein coupling the second surface to the first substrate includes compression.

10. The method according to claim 8, wherein the bonding material is of a material chosen from glass frit, polymer, eutectic metal, and thermocompression metal.

11. The method of claim 8, wherein the bonding material does not completely fill the first recess.

12. The method of claim 8, wherein the coupling includes exposing the bonding material to a temperature ranging between 150° C. and 450° C.

13. The method of claim 8, wherein the second substrate includes a second recess in the central portion.

14. The method of claim 13, wherein the microelectromechanical structure faces the second recess.

15. A method, comprising:
   forming a first recess in a central portion of a first substrate;
   forming a second recess in a peripheral portion of the first substrate,
   coupling the first substrate to a second substrate, the coupling including depositing a bonding structure in the second recess; and
   forming an opening in a second substrate, the opening separating a peripheral portion of the second substrate from a central portion of the second substrate, the central portion of the second substrate being surrounded by the second recess, the second substrate including a microelectromechanical structure.

16. The method of claim 15, wherein the first substrate is a first semiconductor material and the second substrate is a second semiconductor material, wherein the bonding structure is a material that compresses while the first and second substrates are coupled together.

17. The method of claim 15, wherein the second recess comprises trenches, wherein during the coupling, the bonding structure flows into the trenches.

18. The method of claim 15, wherein the bonding structure does not completely fill the second recess.

19. The method of claim 15, wherein the bonding structure includes glass frit, polymer, eutectic metal, or thermocompression metal.

20. The method of claim 15, wherein the microelectromechanical structure includes a micromirror, an inertial sensor, or a pressure sensor.

\* \* \* \* \*